United States Patent
Yata et al.

(10) Patent No.: US 7,368,067 B2
(45) Date of Patent: May 6, 2008

(54) P-TYPE ZINC OXIDE SEMICONDUCTOR FILM AND PROCESS FOR PREPARATION THEREOF

(75) Inventors: Shigeo Yata, Hirakata (JP); Kenichiro Wakisaka, Iga (JP); Takeshi Kobayashi, Osaka (JP)

(73) Assignee: Sanyo Electric Co., Ltd., Osaka (JP)

( * ) Notice: Subject to any disclaimer, the term of this patent is extended or adjusted under 35 U.S.C. 154(b) by 300 days.

(21) Appl. No.: 11/042,314

(22) Filed: Jan. 26, 2005

(65) Prior Publication Data

US 2005/0170971 A1 Aug. 4, 2005

(30) Foreign Application Priority Data

Jan. 28, 2004 (JP) ............................. 2004-020022

(51) Int. Cl.
  *H01B 1/00* (2006.01)
  *H01B 1/12* (2006.01)
  *H01L 29/12* (2006.01)
(52) U.S. Cl. .................... 252/500; 117/108; 257/43; 423/624; 438/46; 438/93; 438/483; 438/488
(58) Field of Classification Search ................ 252/500; 427/596; 117/108; 428/642; 438/46, 93, 438/483, 488; 257/43; 423/624
See application file for complete search history.

(56) References Cited

U.S. PATENT DOCUMENTS 5,728,231 A * 3/1998 Negami et al. ............... 148/33
6,410,162 B1 * 6/2002 White et al. ................. 428/642
6,527,858 B1 * 3/2003 Yoshida et al. .............. 117/108
6,624,441 B2 * 9/2003 Cantwell et al. .............. 257/43
2004/0058462 A1   3/2004 Mishima
2004/0105810 A1 * 6/2004 Ren et al. .................... 423/624
2006/0051522 A1 * 3/2006 Talton ......................... 427/596

FOREIGN PATENT DOCUMENTS

JP    2001-048698 A    2/2001
WO   WO 00/22202      4/2000

OTHER PUBLICATIONS

Nakahara K. et al. "Growth of N-doped and Ga + N-codoped ZnO films by radical source molecular beam epitaxy." Journal of Crystal Growth, 237-239, 2002, pp. 503-508.
Sumiya, M., et al. "SIMS analysis of ZnO films co-doped with N and Ga by temperature gradient pulsed laser deposition." Applied Surface Science, 223, 2004, pp. 206-209.
Sumiya et al.; "IMS Analysis of ZnO Films Co-Doped with N and Ga by Temperature Gradient Pulsed Laser Deposition"; *Applied Surface Science 223*; c. 2003; pp. 206-209.

* cited by examiner

*Primary Examiner*—Mark Kopec
*Assistant Examiner*—Khanh Tuan Nguyen
(74) *Attorney, Agent, or Firm*—McDermott Will & Emery LLP

(57) ABSTRACT

A p-type ZnO semiconductor film comprised mainly of Zn and O elements is disclosed. The film is characterized as containing an alkali metal and nitrogen. Preferably, the alkali metal is contained such that its concentration is distributed to increase toward an end or toward both ends in the thickness direction of the film. More preferably, the alkali metal is contained in the concentration range of $1 \times 10^{18} - 5 \times 10^{21}$ cm$^{-3}$ and the nitrogen in the concentration range of $2 \times 10^{17} - 5 \times 10^{20}$ cm$^{-3}$.

10 Claims, 3 Drawing Sheets

F I G. 1
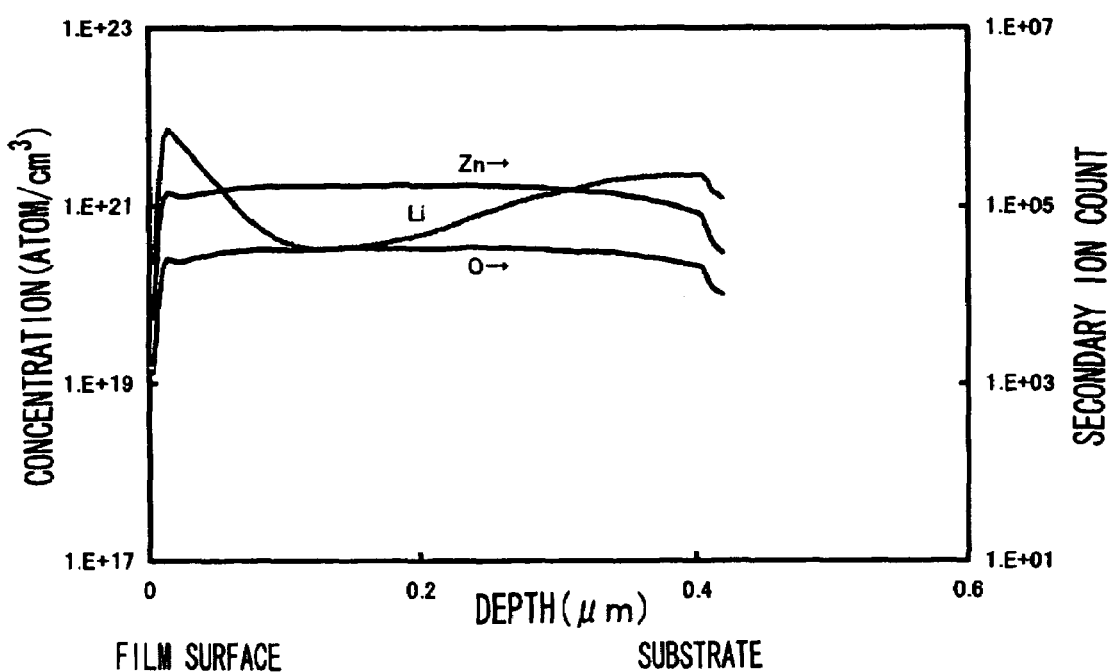
F I G. 2
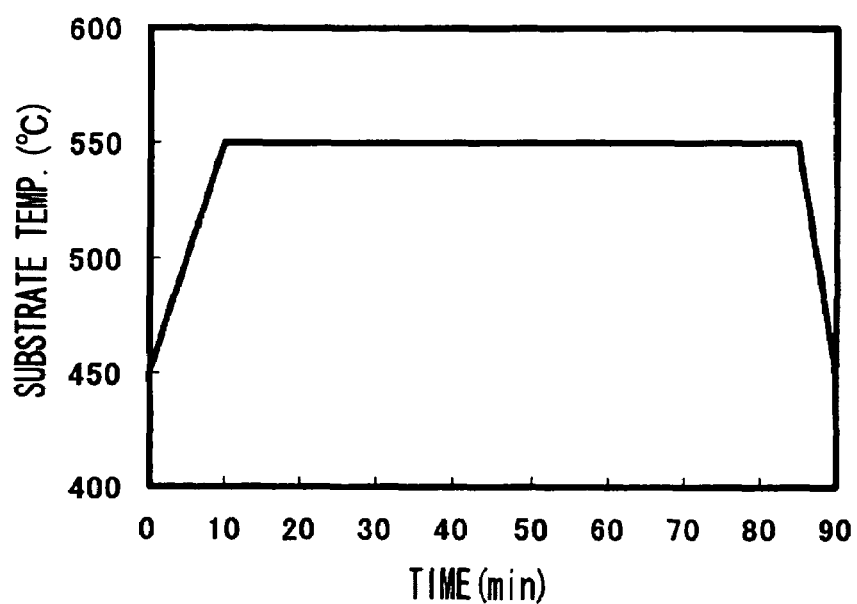

P-TYPE ZINC OXIDE SEMICONDUCTOR FILM AND PROCESS FOR PREPARATION THEREOF

The priority Japanese Patent Application Number 2004-20022 upon which this patent application is based is hereby incorporated by reference.

BACKGROUND OF THE INVENTION

1. Field of the Invention

The present invention relates to a p-type ZnO semiconductor film and a process for preparation thereof.

2. Description of Related Art

In order to realize the new generation of electronic devices, e.g., transparent electronic circuits and ultraviolet light-emitting diodes, using oxide semiconductors, it is essential to develop p-type oxide semiconductors. Zinc oxide (ZnO), because of its high potential, has been recently noted as a promising material for such p-type oxide semiconductors and the associated research and development have been actively conducted.

However, it is extremely difficult to prepare p-type ZnO and only a very few successful examples are reported. As a representative of such successful examples, a codoping method is known which involves simultaneous doping of an acceptor impurity and a donor impurity (see, for example, Japanese Patent Laying-open No. 2001-48698 and PCT Int. Publication No. WO 00/22202).

It is however reported that the follow-up attempts of the reported codoping method by researchers resulted in the failure to obtain the p-type ZnO (K. Nakahara et al., Journal of Crystal Growth, 237-239 (2002), pp. 503-508; M. Sumiya et al., Applied Surface Science, 223 (2004), pp. 206-209; and others). As such, a highly reproducible process to obtain the p-type ZnO has not been established to date.

SUMMARY OF THE INVENTION

It is an object of the present invention to provide a highly reproducible p-type ZnO semiconductor film and a process for preparation thereof.

The present invention provides a p-type ZnO semiconductor film comprised mainly of Zn and O elements. Characteristically, the film contains an alkali metal and nitrogen.

In ZnO semiconductor films, mere doping of nitrogen does not enable the p-type conduction thereof but causes self-compensation to render their conduction to n-type. Mere doping of an alkali metal, such as lithium, renders them insulative. In the present invention, ZnO is rendered p-type by codoping of an alkali metal and nitrogen. It is believed that doping of an alkali metal such as lithium leads to compensation of donor defects in a ZnO film that result from oxygen depletion and additional doping of nitrogen produces holes as nitrogen serves as an acceptor to result in obtaining a p-type ZnO semiconductor film.

Also, a larger proportion of the donor defects which impede p-type conduction of the ZnO film is concentrated toward both ends in a thickness direction of the ZnO film. Therefore, if an alkali metal, e.g., lithium, is contained such that a concentration thereof is distributed to increase toward a surface of the film and/or toward an interface between the film and a substrate in the thickness direction of the ZnO film, the donor defects can be compensated efficiently to result in obtaining a satisfactory p-type ZnO semiconductor film. Therefore, in the present invention, the alkali metal is preferably contained such that its concentration is distributed to increase toward an end or toward both ends in the thickness direction of the film.

The alkali metal is contained in any concentration which will result in obtaining a p-type ZnO semiconductor film. The mean concentration of the alkali metal in the film is preferably in the range of $1\times10^{18}$-$5\times10^{21}$ cm$^{-3}$.

Nitrogen is contained in any concentration which will result in obtaining a p-type ZnO semiconductor film. Nitrogen is preferably contained in the concentration range of $2\times10^{17}$-$5\times10^{20}$ cm$^{-3}$.

The present invention is further directed to a process for preparing the p-type ZnO semiconductor film of the present invention. In accordance with the preparation process of the present invention, a p-type ZnO semiconductor film comprised mainly of Zn and O elements is deposited on a substrate. Characteristically, the p-type ZnO semiconductor film containing an alkali metal and nitrogen is deposited on the substrate.

In the preparation process of the present invention, any deposition method which will result in deposition on a substrate of a p-type ZnO semiconductor film containing an alkali metal and nitrogen can be utilized. Incorporation of the alkali metal into a semiconductor film is preferably achieved by using a zinc oxide (ZnO) target containing the alkali metal.

Incorporation of nitrogen is preferably achieved by using a nitrogen radical source.

Another applicable method for incorporation of the alkali metal into a semiconductor film utilizes the alkali metal or a compound or mixture containing the alkali metal, which is evaporated or vaporized during film formation of zinc oxide (ZnO) so that it is introduced into the resulting film. Alternatively, an ion implantation method may be utilized to introduce zinc oxide (ZnO), either during or after film formation, into the resulting film.

Another applicable method for incorporation of nitrogen into a semiconductor film involves supplying a nitrogen plasma while zinc oxide (ZnO) is deposited to form a film. NO or NO$_2$, either in the gaseous or plasma form, may be supplied while zinc oxide (ZnO) is deposited. Similarly to the case of the alkali metal, an ion implantation method can also be utilized.

In the preparation method of the present invention, it is preferred that the alkali metal is contained such that a concentration thereof is distributed to increase toward the substrate and/or toward a surface of the film in the thickness direction of the semiconductor film, as described above. That is, the alkali metal is preferably contained such that its concentration is distributed to increase toward the substrate and/or toward a surface of the film.

Formation of such a concentration distribution is preferably accomplished by controlling a temperature of the substrate, i.e., by controlling the substrate temperature at relatively lower levels during the initial and/or final stage(s) of film formation of the semiconductor. It is generally preferred that the substrate temperature during the initial and/or final stage(s) of film formation is controlled at a level that is 50-150° C. lower than a maximum temperature in the film formation.

In the present invention, examples of alkali metals for incorporation into the semiconductor film include lithium, sodium and potassium. The use of lithium is particularly preferred.

In accordance with the present invention, a p-type ZnO semiconductor film can be prepared in a reproducible manner.

BRIEF DESCRIPTION OF THE DRAWINGS

FIG. 1 is a graph showing a lithium concentration profile along the depth of a thin film in an example of the present invention;

FIG. 2 is a graph showing a substrate temperature change in an example of the present invention;

DESCRIPTION OF THE PREFERRED EXAMPLES

The present invention is now described in detail with reference to examples. The following examples illustrate the practice of the present invention but are not intended to be limiting thereof.

Example 1

Figure 5:
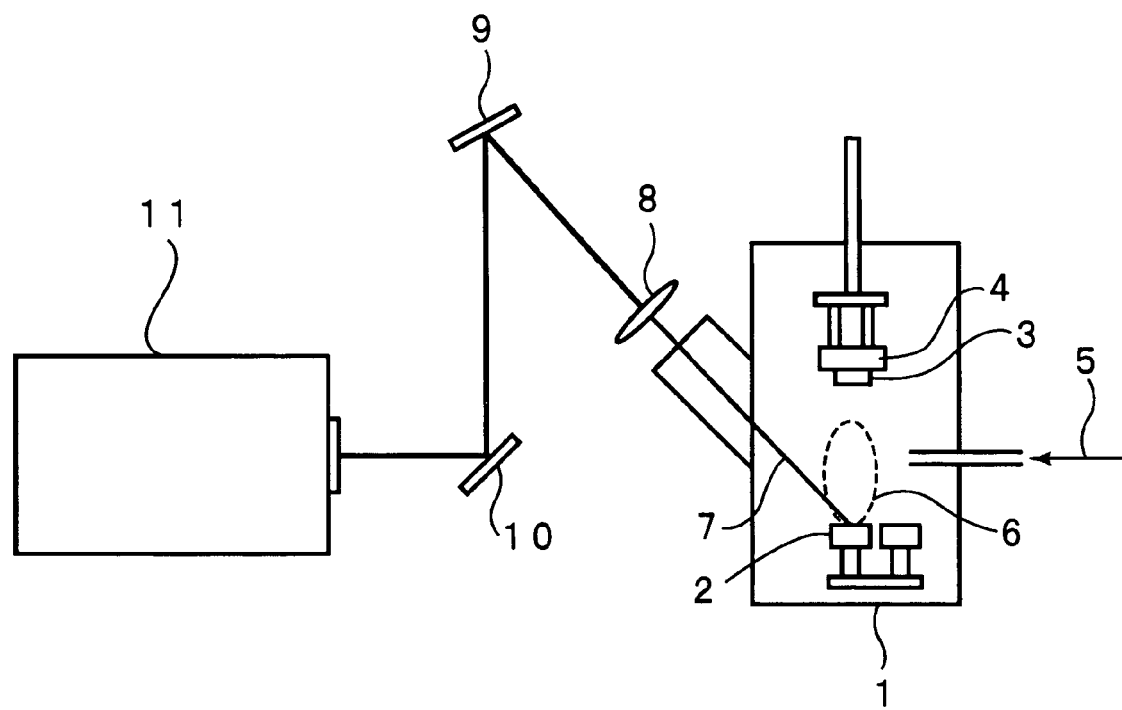
FIG. 5 is a schematic constitutional view of a thin film-forming apparatus used to prepare a ZnO film in an example of the present invention.

Using the apparatus shown in FIG. 5, a ZnO semiconductor film doped with lithium and nitrogen was formed on a c-plane sapphire substrate. Referring to FIG. 5, a vacuum chamber 1 houses a substrate 3 held on a substrate holder 4 and a target 2 located to oppose to the substrate 3. A laser 11 emits a laser beam 7 which is reflected at a sequence of lenses 9 and 10, passes through a focusing lens 8 and then enters the vacuum chamber 1 where the target 2 is illuminated at its surface. A plume 6 is produced on the surface of the target 2 illuminated with the laser beam 7. Although not shown in FIG. 5, N (nitrogen) radicals 5 from an N radical source are introduced into the vacuum chamber 1.

Using the apparatus shown in FIG. 5, a p-type ZnO semiconductor film was formed under the following forming condition 1. The formed p-type ZnO semiconductor film was about 400 nm thick.

(Forming Condition 1)
Forming method: PLD (pulsed laser deposition) method
Target: Li-doped ZnO target (Li content: 5 weight %)
Laser: ArF laser
Laser power: 1 J/cm$^2$
Substrate temperature: 550° C.
Chamber pressure: $3\times10^{-2}$ Pa
N$_2$ gas flow rate: 5 sccm
N radical source RF power: 200 W.

Using an AC magnetic Hall effect measurement device (product of Toyo Corporation), the formed ZnO film was confirmed as being p-type. This ZnO film showed a resistivity of about $1\times10^3$ Ω·cm and a carrier concentration of about $1\times10^{15}$ cm$^{-3}$.

As confirmed above, codoping of Li and N results in obtaining a p-type ZnO film. It is believed that doping of Li leads to compensating donor defects in a ZnO film to thereby render it insulative and further doping of nitrogen produces holes as nitrogen serves as an acceptor, resulting in obtaining the p-type ZnO film.

Comparative Example 1

The procedure of the preceding Example 1 was followed, except that the thin film-forming condition was altered to the below-specified forming condition 2, to form N-doped ZnO semiconductor films (film thickness: about 400 nm).

(Forming Condition 2)
Forming method: PLD method
Target: ZnO target
Laser: ArF laser Laser power: 1 J/cm$^2$
Substrate temperature: 400-650° C.
Chamber pressure: $3\times10^{-2}$ Pa
N$_2$ gas flow rate: 5 sccm
N radical source RF power: 50-500 W.

The obtained films were all n-type and showed properties of resistivity of $10^0$-$10^2$ Ω·cm and carrier concentration of $10^{16}$-$10^{17}$ cm$^{-3}$.

Comparative Example 2

The procedure of the preceding Example 1 was followed, except that the thin film-forming condition was altered to the below-specified forming condition 3, to form Li-doped ZnO semiconductor films (film thickness: about 400 nm).

(Forming Condition 3)
Forming method: PLD method
Target: Li-doped ZnO target (Li content: 1 or 5 weight %)
Laser: ArF laser
Laser power: 1 J/cm$^2$
Substrate temperature: 400-650° C.
Chamber pressure: about $1\times10^{-4}$ Pa.

The obtained films all showed high resistivities of $10^6$-$10^8$ Ω·cm and were almost insulative.

Example 2

As shown in FIG. 2, the substrate temperature was controlled at relatively lower levels during the initial and final stages of film formation. Otherwise, The procedure of the preceding Example 1 was followed to form a ZnO film.

The resulting p-type ZnO film had a carrier concentration of $4\times10^{16}$ cm$^{-3}$ and showed a further property improvement over that obtained in Example 1.

FIG. 1 is a graph showing an Li concentration profile in the thin film, when measured by SIMS. As shown in FIG. 1, the lithium content in the thin film is higher at locations closer to the film surface and the substrate surface. This is believed due to the substrate temperature that is controlled at lower levels during the initial and final stages of thin-film formation. The reason for the improvement in film properties when the lithium content is rendered higher at locations closer to the film surface and the substrate surface is most probably because a larger proportion of donor defects which impede p-type conduction of the film is concentrated toward the film surface and the substrate surface. That is, it is believed that the film properties can be efficiently improved by rendering the lithium concentration relatively higher at locations where a greater proportion of donor defects exists.

In the above Example, the lithium content in the thin film is higher at both locations closer to the film surface and closer to the substrate surface. However, in the present invention, the lithium content in the thin film may be higher only at location closer to the film surface or at location closer to the substrate surface.

Example 3

The influence of the carrier concentration on film properties was studied by varying a nitrogen content (amount of N) in a p-type ZnO semiconductor film.

The below-specified forming condition 4 was utilized to form a thin film. The nitrogen content in the thin film was varied by controlling an N radical source RF power and a substrate temperature. The nitrogen content in the film tends to increase with the higher N radical source RF power and decrease with the higher substrate temperature.

(Forming Condition 4)
Forming method: PLD method
Target: Li-doped ZnO target (Li content: 5 weight %)

Laser: ArF laser
Laser power: 1 J/cm$^2$
Substrate temperature: 400-650° C.
Chamber pressure: 3×10$^{-2}$ Pa
N$_2$ gas flow rate: 5 sccm
N radical source RF power: 50-500 W
(wherein the substrate temperature, while given above by the maximum value shown in FIG. 2, is controlled at a level 100° C. lower than the maximum level during the initial and final stages of thin-film formation and is varied with time in accordance with the temperature profile shown in FIG. 2).

Figure 3:
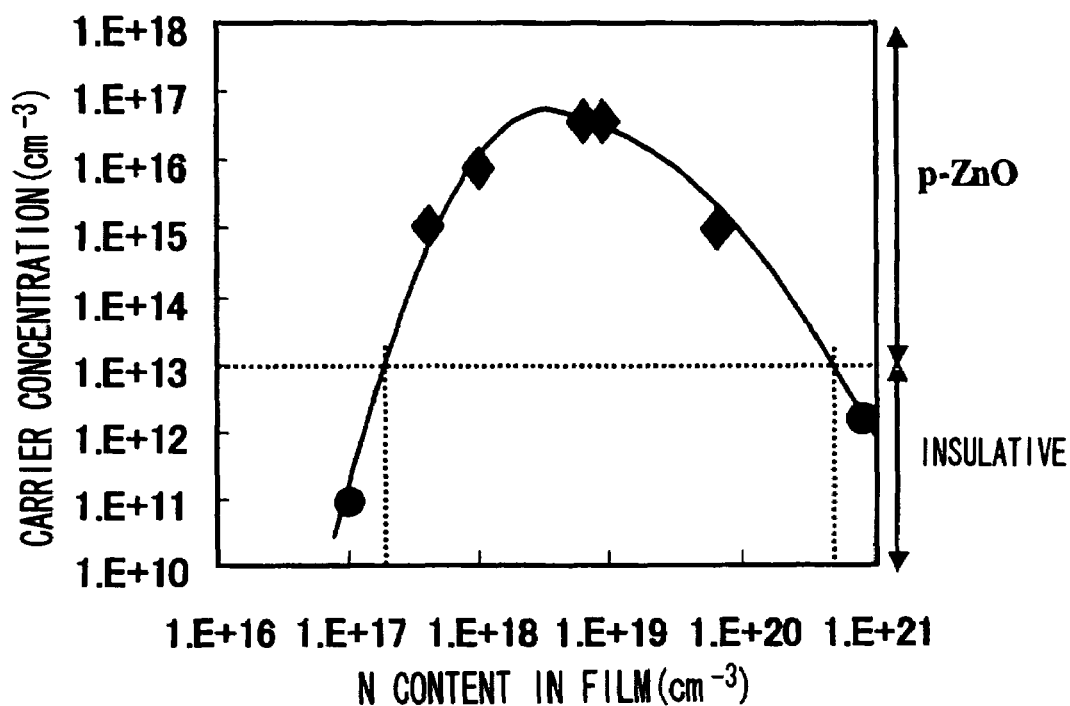
FIG. 3 is a graph showing a relationship between a nitrogen content and a carrier density of a thin film in an example of the present invention.

FIG. 3 is a graph showing a carrier concentration of the ZnO film obtained with a varied nitrogen content (amount of N) in the thin film. An average lithium content of the ZnO film shown in FIG. 3 is 1×10$^{21}$ cm$^{-3}$.

As shown in FIG. 3, the ZnO film becomes insulative when the carrier concentration falls below 1×10$^{13}$ cm$^{-3}$. Therefore, a p-type ZnO film can be prepared when the nitrogen content (amount of N) in the film is within the range of 2×10$^{17}$ cm$^{-3}$-5×10$^{20}$ cm$^{-3}$, as can be clearly seen from FIG. 3.

Example 4

The influence of the carrier concentration on film properties was studied by varying a lithium mean content (amount of Li) in a p-type ZnO semiconductor film.

The below-specified forming condition 5 was utilized to form a thin film. The lithium mean content in the film was varied by controlling a lithium concentration in the target and a substrate temperature. The lithium mean content in the film increases with the higher lithium concentration in the target and decreases with the higher substrate temperature.

(Forming Condition 5)
Forming method: PLD method
Target: Li-doped ZnO target (Li content: 0.5-5 weight %)
Laser: ArF laser
Laser power: 1 J/cm$^2$
Substrate temperature: 400-650° C.
Chamber pressure: 3×10$^{-2}$ Pa
N$_2$ gas flow rate: 5 sccm
N radical source RF power: 200 W
(wherein the substrate temperature, while given above by the maximum value shown in FIG. 2, is controlled at a level 100° C. lower than the maximum level during the initial and final stages of thin-film formation and is varied with time in accordance with the temperature profile shown in FIG. 2).

Figure 4:
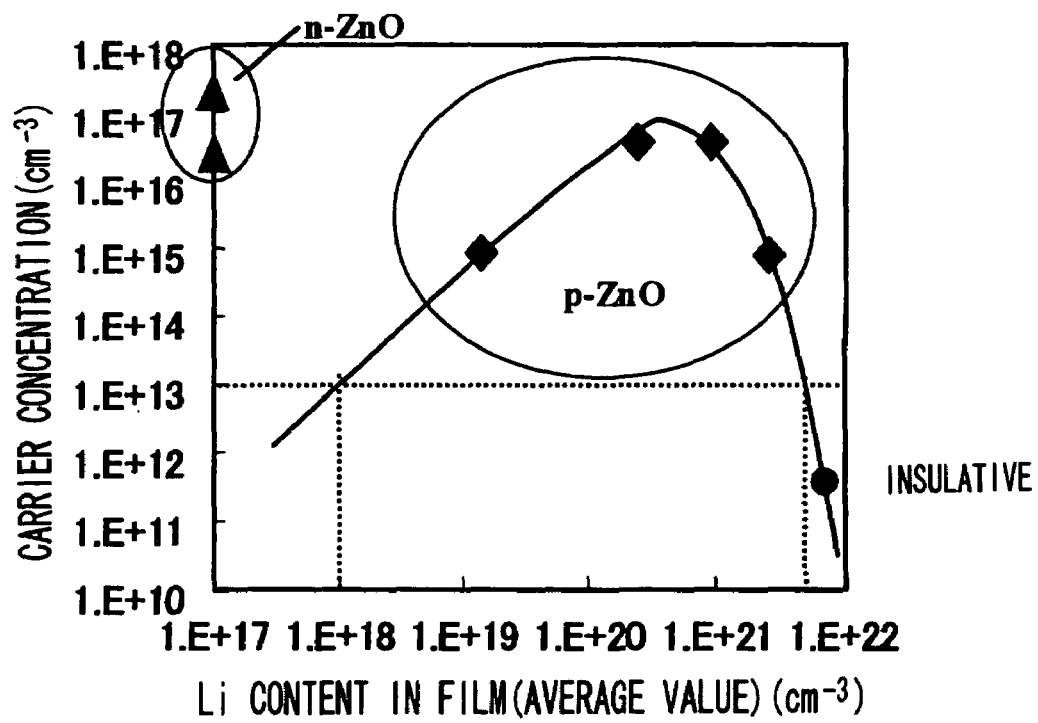
FIG. 4 is a graph showing a relationship between a lithium mean content and a carrier density in a thin film in an example of the present invention.

FIG. 4 is a graph showing a carrier concentration as related to the lithium mean content (amount of Li) in the film. An average lithium content of the ZnO films shown in FIG. 4 is about 1×10$^{19}$ cm$^{-3}$.

As shown in FIG. 4, the ZnO film becomes n-type when the lithium mean content in the film is excessively low. Therefore, a p-type ZnO film can be prepared when the lithium mean content in the film is maintained within the range of 1×10$^{18}$ cm$^{-3}$-5×10$^{21}$ cm$^{-3}$.

In the above Examples, p-type ZnO semiconductor films are formed using lithium (Li) as the alkali metal. However, the use of the other alkali metal such as sodium (Na) or potassium (K) also results in the formation of p-type ZnO semiconductor films.

What is claimed is:

1. A p-type ZnO semiconductor film comprised mainly of Zn and O elements, said film containing an alkali metal and nitrogen,
    wherein said alkali metal is contained in the concentration range of 1×10$^{18}$-5×10$^{21}$ cm$^{-3}$,
    said nitrogen is contained in the concentration range of 2×10$^{17}$-5×10$^{20}$ cm$^{-3}$, and
    said alkali metal is contained such that its concentration is distributed to increase toward both ends in the thickness direction of the film.

2. The p-type ZnO semiconductor film of claim 1, wherein said alkali metal is lithium.

3. A process for preparing a p-type ZnO semiconductor film according to claim 1, wherein the p-type ZnO semiconductor film is deposited on a substrate.

4. The process of claim 3, wherein said alkali metal is incorporated into said semiconductor film using a target containing the alkali metal.

5. The process of claim 3, wherein said nitrogen is incorporated into said semiconductor film using a nitrogen radical source.

6. The process of claim 3, wherein said alkali metal is contained such that its concentration is distributed to increase toward said substrate or toward a surface of said semiconductor film.

7. The process of claim 6, wherein said concentration distribution of the alkali metal is formed by controlling a substrate temperature at relatively lower levels during the initial or final forming stage of said semiconductor film.

8. The process of claim 3, wherein said alkali metal is contained such that its concentration is distributed to increase toward said substrate and toward a surface of said semiconductor film.

9. The process of claim 8, wherein said concentration distribution of the alkali metal is formed by controlling a substrate temperature at relatively lower levels during the initial and final forming stages of said semiconductor film.

10. The process of claim 3, wherein said alkali metal is lithium.

* * * * *